United States Patent
Azumo et al.

(10) Patent No.: US 11,598,001 B2
(45) Date of Patent: Mar. 7, 2023

(54) FILM FORMING METHOD

(71) Applicant: Tokyo Electron Limited, Tokyo (JP)

(72) Inventors: Shuji Azumo, Nirasaki (JP); Shinichi Ike, Gyeonggi-do (KR); Yumiko Kawano, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/166,657

(22) Filed: Feb. 3, 2021

(65) Prior Publication Data
US 2021/0246547 A1 Aug. 12, 2021

(30) Foreign Application Priority Data
Feb. 6, 2020 (JP) .............................. JP2020-019137

(51) Int. Cl.
*C23C 16/04* (2006.01)
*H01L 21/02* (2006.01)
(Continued)

(52) U.S. Cl.
CPC .............. *C23C 16/04* (2013.01); *C23C 16/01* (2013.01); *C23C 16/0272* (2013.01);
(Continued)

(58) Field of Classification Search
CPC ... C23C 16/04; C23C 16/0272; C23C 16/403; C23C 16/45525
See application file for complete search history.

(56) References Cited

U.S. PATENT DOCUMENTS

2002/0182385 A1* 12/2002 Senkevich ............. B82Y 30/00
428/209
2010/0261071 A1* 10/2010 Lopatin .................. H01M 4/66
57/295
(Continued)

FOREIGN PATENT DOCUMENTS

JP 2007-533156 A 11/2007
JP 2017-212320 A 11/2017

OTHER PUBLICATIONS

Hashemi, Fatemah Sadat Minaye, et al., "Selective Deposition of Dielectrics: Limits and Advantages of Alkanethiol Blocking Agents on Metal-Dielectric Patterns". ACS Appl. Mater. Interfaces 2016, 8, 33264-33272.*
(Continued)

*Primary Examiner* — Bret P Chen
(74) *Attorney, Agent, or Firm* — Nath, Goldberg & Meyer; Jerald L. Meyer; Tanya E. Harkins (57) ABSTRACT

A film forming method includes: preparing a substrate having a metal layer formed on a surface of a first region and an insulating layer formed on a surface of a second region, wherein the metal layer is formed of a first metal; forming a self-assembled film on a surface of the metal layer by supplying a source gas of the self-assembled film; after forming the self-assembled film, forming an oxide film of a second metal on the insulating layer through an atomic layer deposition method by repeating a supply of a precursor gas containing the second metal and a supply of an oxidizing gas; and reducing an oxide film of the first metal formed on a surface of the first metal by supplying a reducing gas after the supply of the oxidizing gas and before the supply of the precursor gas.

19 Claims, 5 Drawing Sheets

(51) Int. Cl.
C23C 16/40 (2006.01)
C23C 16/455 (2006.01)
C23C 16/01 (2006.01)
C23C 16/02 (2006.01)
H01L 21/8238 (2006.01)

(52) U.S. Cl.
CPC ...... *C23C 16/403* (2013.01); *C23C 16/45525* (2013.01); *H01L 21/0228* (2013.01); *H01L 21/823857* (2013.01)

(56) References Cited

U.S. PATENT DOCUMENTS

| | | | | |
|---|---|---|---|---|
| 2012/0052681 | A1* | 3/2012 | Marsh | H01L 21/28562 438/763 |
| 2013/0196502 | A1* | 8/2013 | Haukka | C23C 16/45536 438/653 |
| 2015/0294863 | A1* | 10/2015 | Nemani | H01L 21/31155 438/780 |
| 2016/0365280 | A1* | 12/2016 | Brink | H01L 21/31144 |
| 2017/0207193 | A1* | 7/2017 | Bower | B41F 16/0073 |
| 2017/0301542 | A1* | 10/2017 | Maes | G03F 7/0002 |
| 2017/0358482 | A1* | 12/2017 | Chen | H01L 21/28562 |
| 2018/0076027 | A1* | 3/2018 | Tapily | H01L 21/3105 |
| 2018/0350587 | A1* | 12/2018 | Jia | H01L 21/02205 |
| 2019/0017170 | A1* | 1/2019 | Sharma | H01L 21/0228 |
| 2019/0019674 | A1* | 1/2019 | Farm | H01L 21/02211 |
| 2019/0148144 | A1* | 5/2019 | Liu | H01L 21/321 257/632 |
| 2019/0295870 | A1* | 9/2019 | Tapily | C23C 16/06 |
| 2019/0295903 | A1* | 9/2019 | Clark | H01L 21/0226 |
| 2020/0006057 | A1* | 1/2020 | Azumo | C23C 16/4404 |

OTHER PUBLICATIONS

Prasittichai, Chaiya, et al., "Improving Area-Selective Molecular Layer Deposition by Selective SAM Removal". ACS Appl. Mater. Interfaces 2014, 6, 20, 17831-17836.*

Tan, Chuan Seng, et al., "Cu Surface Passivation with Self-Assembled Monolayer (SAM) and Its Application for Wafer Bonding at Moderately Low Temperature". 2013 ECS Trans. 50 (7) 115-123 (2012).*

Lim, Dau Fatt, et al., "Achieving low temperature Cu to Cu diffusion bonding with self assembly monolayer (SAM) passivation". 2009 IEEE International Conference on 3D System Integration, 2009, pp. 1-5, doi: 10.1109/3DIC.2009.5306545.*

Zhong, Wei, et al., "InSnZnO Thin-Film Transistors With VaporPhase Self-Assembled Monolayer as Passivation Layer". IEEE Electron Device Letters, vol. 39, No. 11, pp. 1680-1683, Nov. 2018, doi: 10.1109/LED.2018.2872352.*

Budz, H.A., et al., "Passivation of GaAs by octadecanethiol self-assembled monolayers deposited from liquid and vapor phases". J. Vac. Sci. Technol. B 27(2), Mar./Apr. 2009, pp. 637-648.*

Parkl, Mi H., et al., "Selective Atomic Layer Deposition of Titanium Oxide on Patterned Self-Assembled Monolayers Formed by Microcontact Printing". Langmuir, Mar. 16, 2004, 20(6) 2257-2260.*

Bobb-Semple, Dara, et al., "Area-Selective Atomic Layer Deposition Assisted by Self-Assembled Monolayers: A Comparison of Cu, Co, W, and Ru". Chem. Mater. 2019, 31, 1635-1645.*

Srisombat, Laongnuan, et al., "Stability: A key issue for self-assembled monolayers on gold as thin-film coatings and nanoparticle protectants". Colloids and Surfaces A: Physicochemical and Engineering Aspects 390 (2011) pp. 1-19.*

Di Benedetto, Sara A., et al., "Molecular Self-Assembled Monolayers and Multilayers for Organic and Unconventional Inorganic Thin-Film Transistor Applications". Advanced Materials 2009, 21, 1407-1433.*

Mcdowell, M., et al., "Improved organic thin-film transistor performance using novel self-assembled monolayers". Appl. Phys. Lett. 88, 073505 (2006) pp. 1-3.*

Gaberle, Julian, et al., "Morphology and Growth Mechanisms of Self-Assembled Films on Insulating Substrates: Role of Molecular Flexibility and Entropy". J. Phys. Chem. C 2017, 121, 8, 4393-4403.*

* cited by examiner

FILM FORMING METHOD

CROSS-REFERENCE TO RELATED APPLICATION

This application is based upon and claims the benefit of priority from Japanese Patent Application No. 2020-019137, filed on Feb. 6, 2020, the entire contents of which are incorporated herein by reference.

TECHNICAL FIELD

The present disclosure relates to a film forming method.

BACKGROUND

Patent Document 1 discloses a technique in which a blocking layer composed of a self-assembled monolayer is formed on a gate dielectric layer, and then a first metal layer is formed on the gate dielectric layer through an atomic layer deposition (ALD) method, whereby the first metal layer is selectively formed in a region of the gate dielectric layer in which the blocking layer is not present without being formed in a region of the gate dielectric layer in which the blocking layer is present.

PRIOR ART DOCUMENT

Patent Document

Japanese laid-open publication No. 2007-533156

SUMMARY

An aspect of the present disclosure provides a film forming method including: preparing a substrate having a metal layer formed on a surface of a first region and an insulating layer formed on a surface of a second region, wherein the metal layer is formed of a first metal; forming a self-assembled film on a surface of the metal layer by supplying a source gas of the self-assembled film; after forming the self-assembled film, forming an oxide film of a second metal on the insulating layer through an atomic layer deposition method by repeating a supply of a precursor gas containing the second metal and a supply of an oxidizing gas; and reducing an oxide film of the first metal formed on a surface of the first metal by supplying a reducing gas after the supply of the oxidizing gas and before the supply of the precursor gas.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, exemplary embodiments for executing the present disclosure will be described with reference to drawings. In the specification and drawings, constituent elements that are substantially the same will be denoted by the same reference numerals, and redundant descriptions may be omitted. The following description will be made using a vertical direction or relationship in the drawings, but it does not represent a universal vertical direction or relationship.

Embodiments

Figure 1:
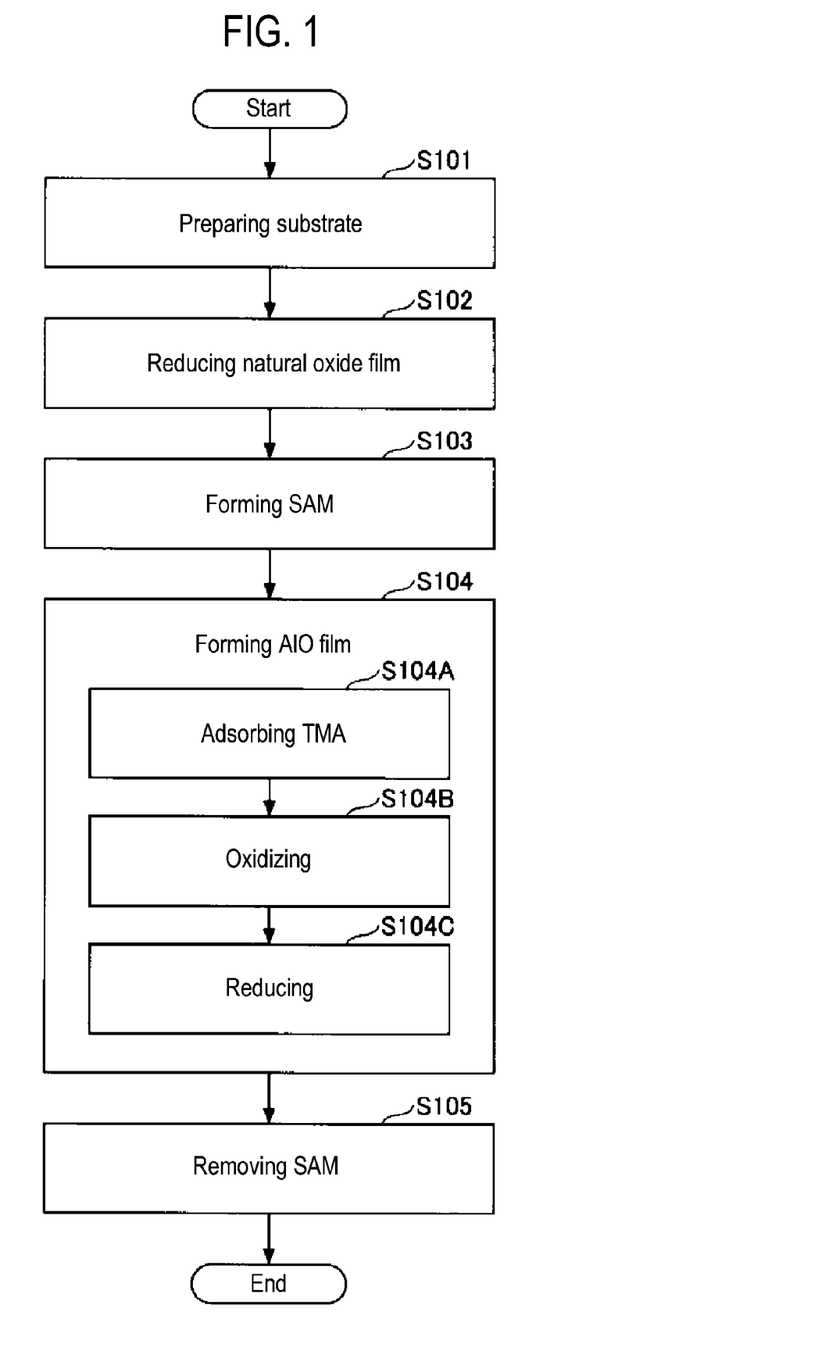
FIG. 1 is a flowchart illustrating an exemplary film forming method according to an embodiment.

FIG. 1 is a flowchart illustrating an exemplary film forming method according to an embodiment. FIGS. 2A to 2E and FIGS. 3A to 3D are cross-sectional views illustrating exemplary states of a substrate in respective steps illustrated in FIG. 1. FIGS. 2A to 2E illustrate states of a substrate 10 corresponding to steps S101 to S105 illustrated in FIG. 1, respectively. FIGS. 3A to 3D illustrate states of the substrate 10 corresponding to steps S104A to S104C illustrated in FIG. 1, respectively, and illustrate details of a state transition from the substrate 10 illustrated in FIG. 2C to the substrate 10 illustrated in FIG. 2D.

Figure 2A:
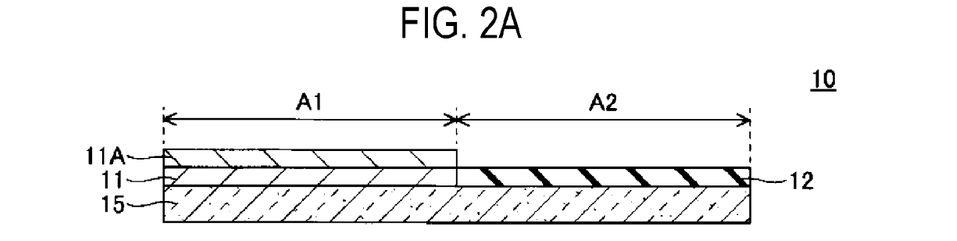
FIGS. 2A to 2E are cross-sectional views illustrating exemplary states of a substrate in respective steps illustrated in FIG. 1.

The film forming method includes step S101 of preparing the substrate 10, as illustrated in FIG. 2A. Preparing the substrate 10 includes, for example, loading the substrate 10 into a processing container (chamber) of a film forming apparatus. The substrate 10 includes a conductive film 11, a natural oxide film 11A, an insulating film 12, and a base substrate 15.

The conductive film 11 and the insulating film 12 are formed on one surface (the top surface in FIG. 2A) of the base substrate 15, and the natural oxide film 11A is formed on one surface (the top surface in FIG. 2A) of the conductive film 11. In FIG. 2A, the natural oxide film 11A and the insulating film 12 are exposed on the surface of the substrate 10.

The substrate 10 has a first region A1 and a second region A2. Here, as an example, the first region A1 and the second region A2 are adjacent to each other in a plan view. The conductive film 11 is formed on the top surface of the base substrate 15 in the first region A1, and the insulating film 12 is formed on the top surface of the base substrate 15 in the second region A2. The natural oxide film 11A is formed on the top surface of the conductive film 11 in the first region A1.

FIG. 2A shows one first region A1, but two or more first regions A1 may be provided. For example, two first regions A1 may be arranged with the second region A2 interposed therebetween. Similarly, FIG. 2A shows one second region A2, but two or more second regions A2 may be provided. For example, two second regions A2 may be arranged with the first area A1 interposed therebetween.

Although only the first region A1 and the second region A2 are shown in FIG. 2A, a third region may exist. The third region is a region in which a layer formed of a material different from those of the conductive film 11 in the first region A1 and the insulating film 12 in the second region A2 is exposed. The third region may be disposed between the first region A1 and the second region A2, or may be disposed outside the first region A1 and the second region A2.

The conductive film 11 may be an exemplary metallic layer formed of a first metal. The first metal is a metal such as copper (Cu), cobalt (Co), tungsten (W), or ruthenium (Ru). The surfaces of these metals are naturally oxidized in the atmosphere over time, and a product of the oxidation is the natural oxide film 11A. The natural oxide film 11A is removable through a reduction process.

Here, as an example, a mode in which the conductive film 11 is formed of copper (Cu) and the natural oxide film 11A is a copper oxide formed through natural oxidation will be described. The copper oxide as the natural oxide film 11A may include CuO and $Cu_2O$.

The illustrating film 12 is an example of an insulating layer. The insulating layer is formed of, for example, an insulating material containing silicon (Si), such as silicon oxide, silicon nitride, silicon oxynitride, silicon carbide, silicon oxycarbide, or silicon oxycarbonitride. Hereinafter, silicon oxide is also referred to as SiO regardless of the composition ratio of oxygen and silicon. Similarly, silicon nitride is also referred to as SiN, silicon oxynitride is also referred to as SiON, silicon carbide is also referred to as SiC, silicon oxycarbide is also referred to as SiOC, and silicon oxycarbonitride is also referred to as SiOCN. The insulating layer is formed of SiO in the present embodiment.

The base substrate 15 is a semiconductor substrate such as a silicon wafer. The substrate 10 may further include, between the base substrate 15 and the conductive film 11, a base film formed of a material different from those of the base substrate 15 and the conductive film 11. Similarly, the substrate 10 may further include, between the base substrate 15 and the insulating film 12, a base film formed of a material different from those of the base substrate 15 and the insulating film 12.

Such a base film may be, for example, a SiN layer or the like. The SiN layer or the like may be, for example, an etch stop layer that stops an etching process.

Figure 2B:
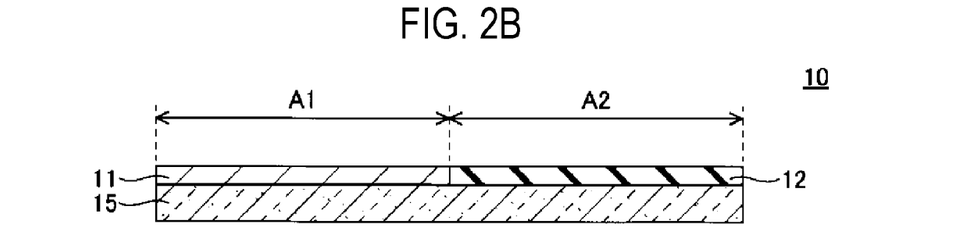

The film forming method further includes step S102 of manufacturing the substrate 10 illustrated in FIG. 2B by reducing the natural oxide film 11A (see FIG. 2A). In order to reduce the natural oxide film 11A, for example, flow rates of hydrogen ($H_2$) and argon (Ar) in the processing container of the film forming apparatus are set to 100 sccm and 2500 sccm, respectively, and a pressure in the processing container is set to 1 torr to 10 torr (133.32 Pa to 1333.22 Pa). In addition, a susceptor is heated such that a temperature of the substrate 10 becomes 150 degrees C. to 200 degrees C. under a hydrogen atmosphere in which hydrogen is less than 0.5% of the atmospheric gas in the processing container.

Through step S102, the copper oxide as the natural oxide film 11A is reduced to Cu and removed. As a result, as illustrated in FIG. 2B, the substrate 10 having the conductive film 11, the insulating film 12, and the base substrate 15 is obtained. Cu serving as the conductive film 11 is exposed on the surface of the first region A1 of the substrate 10. The reduction process of the natural oxide film 11A may be a reduction process using hydrogen ($H_2$) plasma. The reduction process of the natural oxide film 11A is not limited to a dry process, but may be a wet process using an alcohol, such as isopropyl alcohol (IPA). In addition, the reduction process of the natural oxide film 11A may be a process using organic molecules containing oxygen. Further, the reduction process of the natural oxide film 11A may be a heat treatment such as a forming-gas anneal (FGA) process. The FGA process is a heat treatment in which the natural oxide film 11A is reduced by flowing a nitrogen gas mixed with a small amount of hydrogen in a state in which the substrate 10 is heated to a temperature of, for example, about 300 degrees C. to 450 degrees C.

Figure 2C:
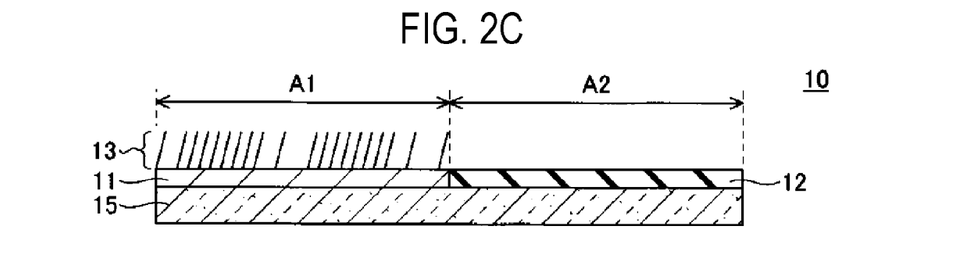

The film forming method further includes step S103 of forming a self-assembled monolayer (SAM) 13, as illustrated in FIG. 2C. The SAM 13 is formed in the first region A1 of the substrate 10, and inhibits formation of an AlO film 14 to be described later (see FIG. 2D). The SAM 13 is not formed in the second region A2. The SAM 13 is an example of a self-assembled film.

An organic compound for forming the SAM 13 may have either a fluorocarbon-based ($CF_x$) functional group or an alkyl-based ($CH_x$) functional group, as long as the organic compound is a thiol-based organic compound. For example, $CH_3(CH_2)[_x]CH_2SH$ [x=1 to 18] and $CF_3(CF_2)[_x]CH_2CH_2SH$ [x=0 to 18] may be used. In addition, the fluorocarbon-based functional group ($CF_x$) includes fluorobenzenethiol.

For example, the flow rates of the thiol-based organic compound in a gas phase and argon (Ar) are set to 100 sccm and 1500 sccm, respectively, and the pressure in the processing container of the film forming apparatus is set to 1 torr to 10 torr (133.32 Pa to 1333.22 Pa). In addition, the susceptor is heated such that the substrate 10 has a temperature of 150 degrees C. to 200 degrees C.

The thiol-based organic compound described above is a compound that easily transfers electrons with a metal oxide. Accordingly, the SAM 13 has a property of being adsorbed on the surface of the conductive film 11 and being unlikely to be adsorbed on the surface of the insulating film 12 on which the transfer of electrons is unlikely to occur. Therefore, the SAM 13 is selectively formed on the surface of the conductive film 11.

Through step S103, the SAM 13 is formed on the surface of the conductive film 11. Thus, as illustrated in FIG. 2C, the substrate 10 in which the conductive film 11 and the SAM 13 are formed in the first region A1 and the insulating film 12 is formed in the second region A2, is obtained. In FIG. 2C, the SAM 13 and the insulating film 12 are exposed on the surface of the substrate 10. In step S103, the selectivity of the thiol-based organic compound for forming the SAM 13 is used.

Figure 2D:
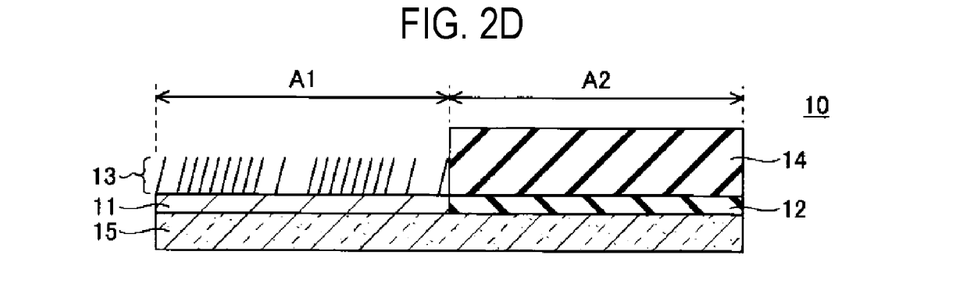

The film forming method further includes step S104 of selectively forming, on the surface of the substrate 10 illustrated in FIG. 2C, the AlO film 14 as an oxide film formed of a second metal on the surface of the insulating film 12 in the second region A2 by using the SAM 13 through an atomic layer deposition (ALD) method, as illustrated in FIG. 2D. Since the SAM 13 inhibits the formation of the AlO film 14, the AlO film 14 is selectively formed in the second region A2. The AlO film 14, which is also an insulating film, may be selectively laminated on the insulating film 12 that originally exists in the second region A2. When a third region exists in addition to the first region A1 and the second region A2, the AlO film 14 may or may not be formed in the third region.

The AlO film 14 may contain oxidized aluminum having a composition other than aluminum oxide $Al_2O_3$ (alumina). That is, here, it is also referred to as AlO regardless of a composition ratio of aluminum and oxygen. Details of the step of forming the AlO film 14 will be described later with reference to FIGS. 3A to 3D.

Figure 2E:
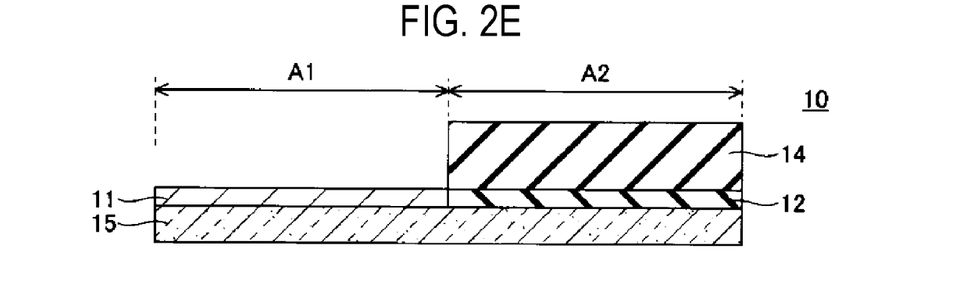

As illustrated in FIG. 2E, the film forming method further includes step S105 of removing the SAM 13 (see FIG. 2D). The removal of the SAM 13 may be performed by, for example, a process using plasma. A plasma generation mechanism used in the process for removing the SAM13 is, for example, a capacitively coupled plasma (CCP) generation mechanism, an inductively coupled plasma (ICP) generation mechanism, or a microwave plasma (MWP) generation mechanism, and any plasma generation mechanism capable of generating radicals may be used. The plasma generation mechanism may be formed integral with and embedded in the processing container. Alternatively, the plasma generation mechanism may be provided separately from the processing container, and a remote plasma apparatus may be used to introduce plasma, which is obtained by preliminarily plasmarizing a plasma generation gas outside the processing container, into the processing container.

Next, details of step S104 of forming the AlO film 14 will be described.

Figure 3A:
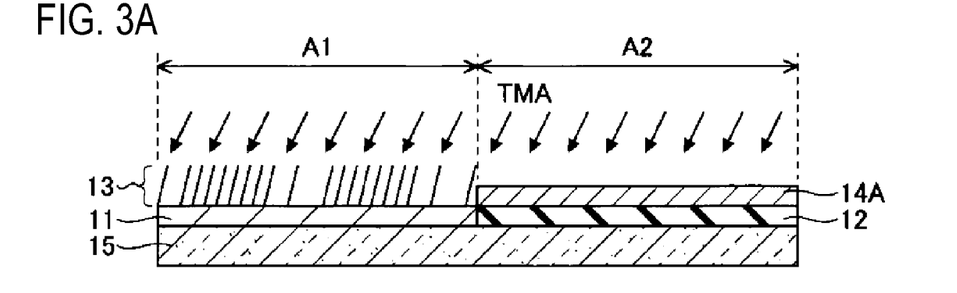
FIGS. 3A to 3D are cross-sectional views illustrating exemplary states of a substrate in respective steps illustrated in FIG. 1.

First, as illustrated in FIG. 3A, the step of forming the AlO film 14 through the ALD method includes step S104A of adsorbing a TMA film 14A in the second region A2 of the substrate 10 illustrated in FIG. 2C by supplying a source gas of trimethyl aluminum (TMA). When step S104A is performed for the first time, the TMA film 14A is adsorbed on the surface of the insulating film 12 in the second region A2 as illustrated in FIG. 3A.

TMA is an organoaluminum compound, and is a precursor for forming the AlO film 14. That is, the source gas of TMA is a precursor gas. The source gas of TMA has a property of adsorbing to a hydroxy group (OH group).

Here, a hydroxy group is present on the surface of SiO of the insulating film 12. In addition, the SAM 13 exhibits high orientation due to the van der Waals force among molecules, tends to be oriented in a direction inclined with respect to a film surface, and has gaps among molecules. There is a possibility that the source gas of TMA enters such gaps. However, since the surface of the conductive film 11 is reduced in the step illustrated in FIG. 2B, no hydroxy group is present on the surface of the conductive film 11.

Therefore, the source gas of TMA is selectively adsorbed on the hydroxy groups on the surface of SiO of the insulating film 12. As an example, in the step of supplying the source gas of TMA, a flow rate of the source gas of TMA is set to 20 sccm to 200 sccm, and the pressure in the processing container of the film forming apparatus is set to 0.1 torr to 10 torr (13.332 Pa to 1333.22 Pa). In addition, the susceptor is heated so that the temperature of the substrate 10 becomes 100 degrees C. to 200 degrees C.

Figure 3B:
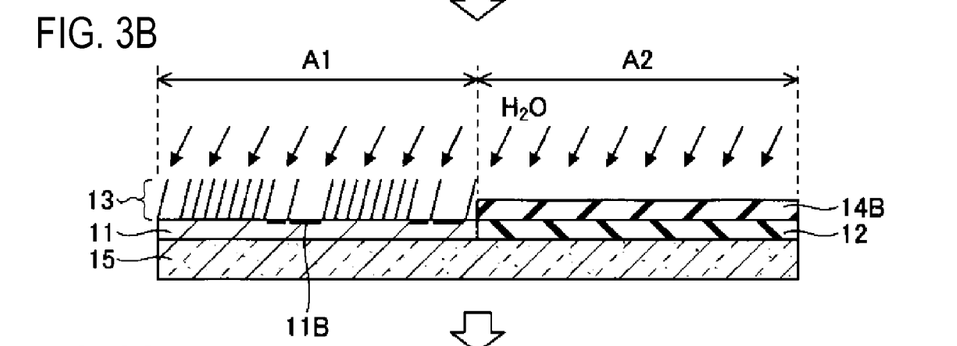

The step of forming the AlO film 14 through the ALD method further includes step S104B of causing $H_2O$ (water vapor) as a reactant (reaction material (here, an oxidizing agent) flow into the processing container, thereby oxidizing the TMA film 14A to form an AlO film 14B, as illustrated in FIG. 3B. $H_2O$ (water vapor) is an example of an oxidizing gas. The oxidizing agent may be a gas, such as oxygen ($O_2$), ozone ($O_3$), or hydrogen peroxide ($H_2O_2$), or may be supplied as remote plasma.

The step of oxidizing the TMA film 14A to form the AlO film 14B may be performed by setting a flow rate of $H_2O$ to, for example, 50 sccm to 300 sccm and the pressure in the processing container of the film forming apparatus to, for example, 0.1 torr to 10 torr (13.332 Pa to 1333.22 Pa).

When each of steps S104A and S104B is performed once, the AlO film 14B having a film thickness of, for example, about 0.1 μm is obtained. Therefore, by repeating steps S104A and S104B, as an example, the AlO film 14 having a film thickness of about 1 μm to 10 μm (see FIG. 2D) may be obtained. When repeating steps S104A and S104B, the processing container may be purged between steps S104A and S104B.

When the AlO film 14B having a film thickness of 0.1 μm is obtained by performing each of steps S104A and S104B once, the AlO film 14 having a film thickness of 1 μm may be obtained by repeating steps S104A and S104B ten times. In this case, in order to obtain the AlO film 14 having a film thickness of 10 μm, steps S104A and S104B may be repeated one hundred times. The repetition number of steps S104A and S104B may be set depending on a desired film thickness of the AlO film 14.

When forming the AlO film 14B by oxidizing the TMA film 14A by causing $H_2O$ (water vapor) to flow into the processing container in step S104B, an oxide film 11B may be formed on the surface of the conductive film 11, as illustrated in FIG. 3B. That is, $H_2O$ (water vapor) may reach the surface of the conductive film 11 (Cu film) through the intermolecular gaps in the SAM 13, and the oxide film 11B composed of CuO may be formed on the surface of the conductive film 11.

Since hydroxy groups are present on the surface of the oxide film 11B, when step S104A is performed in a state in which the oxide film 11B is formed on the surface of the conductive film 11 in step S104B, the source gas of the TMA is adsorbed on the surfaces of the insulating film 12 and the oxide film 11B. In such a case, it is impossible to selectively adsorb the TMA film 14A on the surface of the insulating film 12 in step S104A.

Figure 3C:
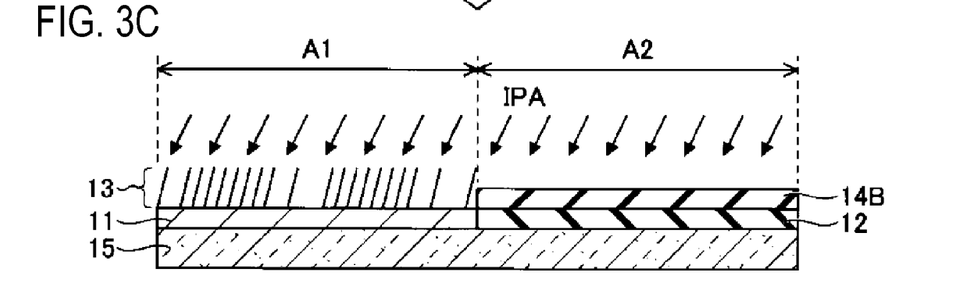

Therefore, the step of forming the AlO film 14 through the ALD method further includes, after step S104B, step S104C of reducing the oxide film (CuO) 11B to Cu by causing an isopropyl alcohol (IPA) gas flow into the processing gas as a reducing gas, as illustrated in FIG. 3C. Since the IPA gas reaches the oxide film 11B on the surface of the conductive film 11 through the intermolecular gaps in the SAM 13, it is possible to reduce the oxide film 11B. When step S104A is performed after step S104C, it is possible to selectively adsorb the TMA film 14A on the surface of the substrate 10 in the second region A2.

In step S104C, a flow rate of the IPA gas may be set to 20 sccm to 200 sccm, and the pressure in the processing container of the film forming apparatus may be set to 0.1 torr to 10 torr (13.332 Pa to 1333.22 Pa).

Since the AlO film 14B is substantially not reduced in step S104C illustrated in FIG. 3C, the AlO film 14B remains after step S104C is completed.

Figure 3D:
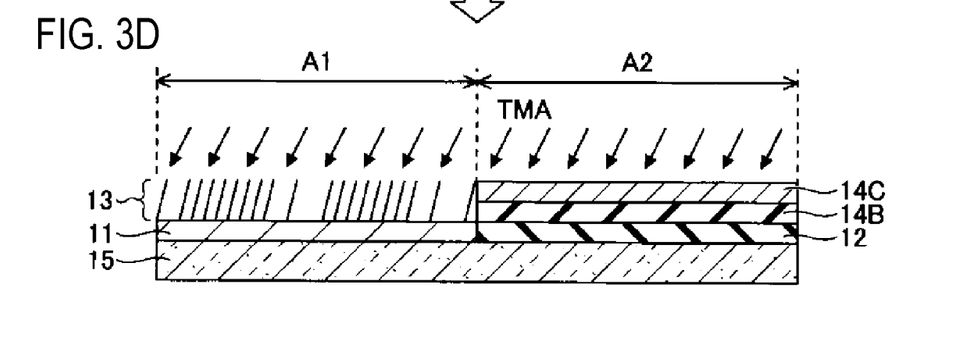

When the surface of the conductive film 11 is reduced in step S104C as described above, even if step S104A is performed again and the source gas of TMA is supplied to the processing container, the TMA is not adsorbed on the surface of the conductive film 11, and a TMA film 14C can be selectively adsorbed on the AlO film 14B, as illustrated in FIG. 3D. The surface of the conductive film 11 may be reduced by supplying, instead of the IPA gas, a hydrogen ($H_2$) gas as the reducing gas when reducing the surface of the conductive film 11 in step S104C.

FIG. 3D illustrates step S104A of supplying the source gas of TMA to the substrate 10 in the same manner as that illustrated in FIG. 3A. FIG. 3A illustrates step S104A of forming the TMA film 14A on the surface of the insulating film 12 for the first time, and FIG. 3D illustrates step S104A of forming the TMA film 14C on the AlO film 14B in the second and subsequent steps S104A when steps S104A and S104B are repeated.

Here, step S104C of reducing the oxide film 11B illustrated in FIG. 3C may be performed every time after step S104B when steps S104A and S104B are repeated, or performed after step S104B each time when steps S104A and S104B are repeated a plurality of times. In the latter case, each time when steps S104A and S104B are repeated a plurality of times, step S104C is performed once after step S104B. That is, step S104C is performed at least one of after step S104B or before step S104A when steps S104A and S104B are performed a plurality of times. Since step S104C is a step of reducing the oxide film (CuO) 11B, which can be formed in step S104B, to Cu, step S104C may be performed after step S104B.

In the case in which the oxide film (CuO) 11B is formed in step S104B as illustrated in FIG. 3B, when steps S104A and S104B are repeated without performing step S104C, a TMA film may be adsorbed on the oxide film 11B in step S104A.

In such a case, it is substantially impossible to reduce the TMA film adsorbed on the oxide film 11B even if the reduction step of step S104C is performed. This is because in the reduction step using the IPA gas as in step S104C, reducing power is insufficient to reduce the TMA film.

Therefore, in the case where step S104C is performed once after step S104B each time when steps S104A and S104B are repeated a plurality of times, step S104C may be performed before the TMA film is adsorbed on the oxide film 11B. That is, step S104C may be performed while the oxide film (CuO) 11B can be reduced and restored to the conductive film (Cu) 11. The number of repetitions may be obtained in advance through, for example, an experiment.

The steps illustrated in FIGS. 3A to 3D may be divided into groups, each of which includes one or more of the steps, and the steps may be performed in processing containers different for each group. However, from the viewpoint of continuously performing the process of reducing the oxide film 11B and the process of supplying the source gas of TMA to the processing container, the steps may be performed in one processing container.

Here, the mode in which the step of forming the AlO film 14 through the ALD method starts from step S104A of adsorbing the source gas of TMA on the surface of the insulating film 12 to form the TMA film 14A as illustrated in FIG. 3A is described. However, the step of reducing the surface of the conductive film 11 may be performed before step S104A in the same manner as that illustrated in step S104C.

As described above, it is possible to form the AlO film 14 illustrated in FIG. 2D by performing S104C after step S104B when the repetition number of steps S104A and S104B reaches a predetermined number of times (once or a plurality of times.

At this time, by performing step S104C after step S104B, even when the oxide film 11B (see FIG. 3B) is formed on the surface of the conductive film 11, the oxide film 11B can be reduced in step S104C. Therefore, when step S104A is subsequently performed as illustrated in FIG. 3D, the selectivity for selectively adsorbing the TMA film 14C in the second region A2 can be enhanced. The TMA film 14C is subsequently oxidized in step S104B illustrated in FIG. 3B to form the AlO film 14B (see FIG. 3C). By repeatedly forming the AlO film, the film thickness of the AlO film 14B (see FIG. 3C) increases, and thus the AlO film 14 illustrated in FIG. 2D is obtained. As described above, by performing step S104C after step S104B, the selectivity when selectively forming the AlO film 14 in the second region A2 can be enhanced.

Therefore, it is possible to provide a film forming method capable of enhancing the selectivity when the AlO film 14 is selectively formed in a desired region by using the SAM 13.

In the above, the mode in which the AlO film 14 as the oxide film formed of the second metal is formed on the insulating film 12 in the second region A2 has been described. However, instead of the AlO film 14, a hafnia (HfO$_2$) film or a zirconia (ZrO$_2$) film may be formed.

When forming a hafnia (hafnium oxide/HfO$_2$) film, tetrakis (dimethylamino) hafnium, tetrakis (diethylamino) hafnium, or tetrakis (ethylmethylamino) hafnium may be used as a precursor gas containing the second metal. When forming a zirconia (zirconium dioxide/ZrO$_2$) film, tetrakis (dimethylamino) zirconium, tetrakis (diethylamino) zirconium, or tetrakis (ethylmethylamino) zirconium may be used as a precursor gas containing the second metal.

Further, since it is possible to enhance the selectivity when selectively forming the AlO film 14 in the second region A2, the throughput can be improved. Thus, it is possible to provide a film forming method capable of realizing a highly productive semiconductor manufacturing process.

In the above, the mode in which all the processes from step S101 to step S105 are performed in the same processing container has been described, but the reduction process in step S102, the process of forming the SAM 13 in step S103, the process of forming the AlO film in step S104, and the process of removing the SAM 13 of step S105 may be performed in different processing containers of the film forming apparatus. For example, it is useful when it is desired to independently set processing conditions such as the heating temperature in each step.

In addition, the process of forming the SAM 13 of step S103 and the process of removing the SAM 13 of step S105 may be performed in the same processing container, and the reduction process in step S102 and the process of forming the AlO film in step S104 may be performed in different processing containers. For example, it is useful when the reduction process in step S102 is performed by a wet process. It is also useful when it is desired to form the AlO film in step S104 in an independent processing container. When the reduction process of step S102 and the reduction process of step S104C are the same process, the reduction process of step S102 and the process of forming the AlO film in step S104 may be performed in the same processing container.

In addition, the preparation in step S101 and the reduction process in step S102 are performed in the same processing container.

<Film Forming System>

Next, a system for carrying out a film forming method according to an embodiment of the present disclosure will be described.

The film forming method according to an embodiment of the present disclosure may be carried out in any of a batch apparatus, a single-wafer apparatus, and a semi-batch apparatus. However, the optimum temperature may differ in each of the above-described steps, and the execution of each step may be hindered when the surface of a substrate is oxidized and thus the surface state is changed. In view of this, a multi-chamber-type single-wafer film forming system, in which each step can be easily set to an optimum temperature and all steps can be performed in a vacuum atmosphere, is appropriate.

Hereinafter, such a multi-chamber-type single-wafer film forming system will be described.

Figure 4:
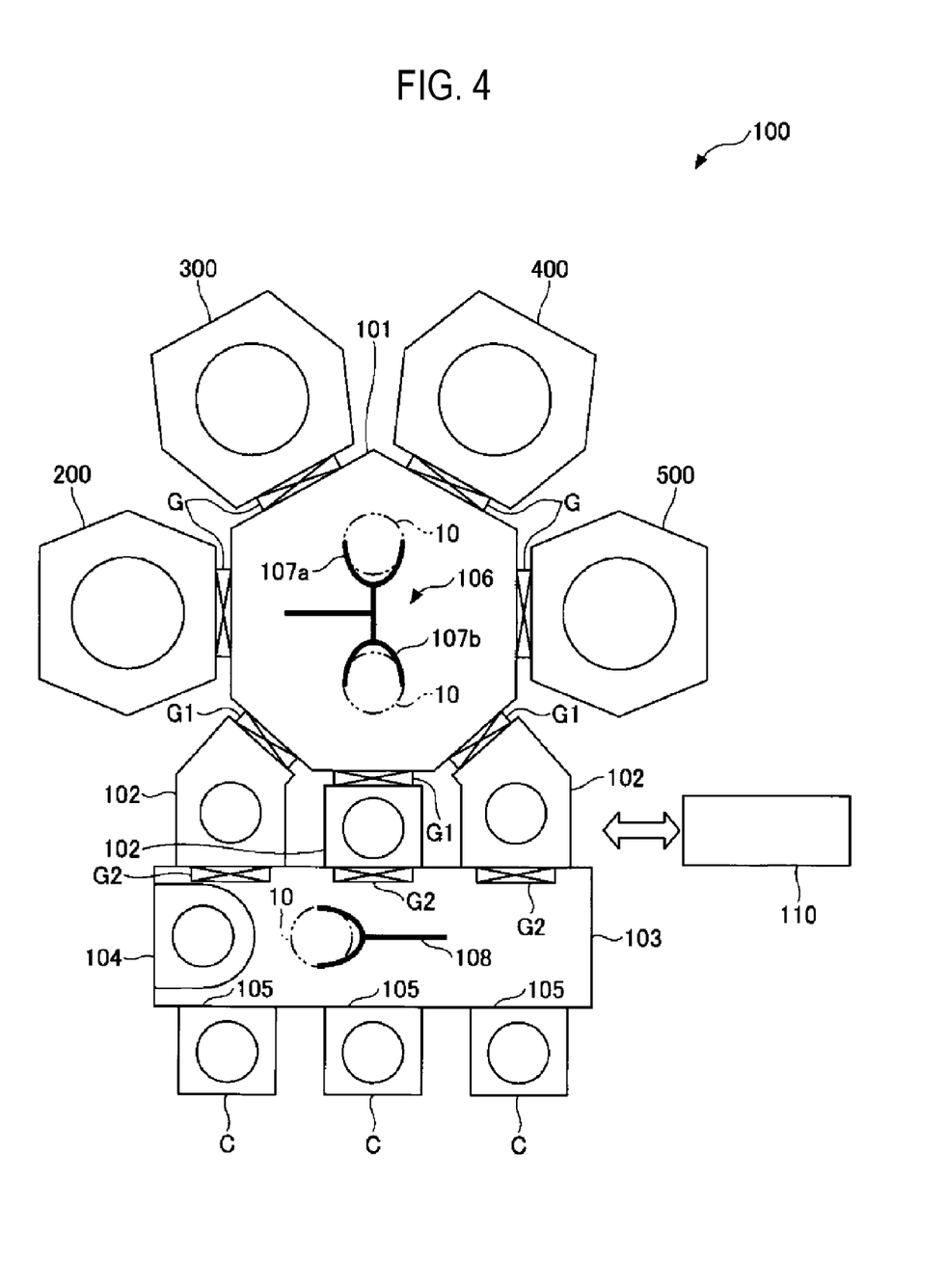
FIG. 4 is a schematic view illustrating an exemplary film forming system for performing the film forming method according to an embodiment.

FIG. 4 is a schematic view illustrating an exemplary film forming system for performing the film forming method according to an embodiment. Here, unless otherwise specified, the case where the substrate 10 is processed will be described.

As illustrated in FIG. 4, a film forming system 100 includes a reducing and oxidizing apparatus 200, an SAM forming apparatus 300, a film forming apparatus 400, and a plasma processing apparatus 500. These apparatuses are connected to four walls of a vacuum transfer chamber 101 having a heptagonal shape in a plan view via gate valves G, respectively. The interior of the vacuum transfer chamber 101 is evacuated by a vacuum pump, and is maintained at a predetermined degree of vacuum. That is, the film forming system 100 is a multi-chamber-type vacuum-processing system, and is capable of continuously carrying out the above-described film forming method without breaking the vacuum.

The reducing and oxidizing apparatus 200 is, for example, a processing apparatus that performs a reduction process on the substrate 10 (see FIG. 2A).

The SAM forming apparatus 300 is an apparatus that forms the SAM 13 on the substrate 10 (see FIG. 2C) by supplying a gaseous thiol-based organic compound and selectively forming the SAM 13.

The film forming apparatus 400 is an apparatus that forms the AlO film 14 on the substrate 10 (see FIG. 2D) through an ALD method.

The plasma processing apparatus 500 is, for example, an apparatus for performing an etching process to remove the SAM 13.

Three load-lock chambers 102 are connected to the other three walls of the vacuum transfer chamber 101 via gate valves G1, respectively. An atmospheric transfer chamber 103 is provided on the side opposite the vacuum transfer chamber 101, with the load-lock chambers 102 interposed therebetween. The three load-lock chambers 102 are connected to the atmospheric transfer chamber 103 via gate valves G2, respectively. The load-lock chambers 102 are provided to control a pressure between atmospheric pressure and vacuum when the substrate 10 is transferred between the atmospheric transfer chamber 103 and the vacuum transfer chamber 101.

A wall of the atmospheric transfer chamber 103 opposite the wall, on which the load-lock chambers 102 are mounted, is provided with three carrier installation ports 105 in each of which a carrier (e.g., a FOUP) C for accommodating the substrate 10 is installed. In addition, on a side wall of the atmospheric transfer chamber 103, an alignment chamber 104 is provided to perform alignment of the substrate 10. The atmospheric transfer chamber 103 is configured to form a downflow of clean air therein.

In the vacuum transfer chamber 101, a first transfer mechanism 106 is provided. The first transfer mechanism 106 transfers the substrate 10 with respect to the reducing and oxidizing apparatus 200, the SAM forming apparatus 300, the film forming apparatus 400, the plasma processing apparatus 500, and the load-lock chambers 102. The first transfer mechanism 106 has two independently movable transfer arms 107a and 107b.

A second transfer mechanism 108 is provided in the atmospheric transfer chamber 103. The second transfer mechanism 108 is configured to transfer the substrate 10 with respect to the carriers C, the load-lock chambers 102, and the alignment chamber 104.

The film forming system 100 further includes an overall controller 110. The overall controller 110 includes a main controller having a CPU (a computer), an input device (e.g., a keyboard or a mouse), an output device (e.g., a printer), a display device (e.g., a display), and a storage device (a storage medium). The main controller controls respective components of the reducing and oxidizing apparatus 200, the SAM forming apparatus 300, the film forming apparatus 400, the plasma processing apparatus 500, the vacuum transfer chamber 101, and the load-lock chambers 102. The main controller of the overall controller 110 causes the film forming system 100 to execute operations for carrying out the film forming method of the embodiment based on, for example, a processing recipe stored in, for example, a storage medium embedded in the storage device or a storage medium set in the storage device. In addition, each device may be provided with a lower-level controller, and the overall controller 110 may be configured as an upper-level controller.

In the film forming system configured as described above, the second transfer mechanism 108 takes out the substrate 10 from the carrier C connected to the atmospheric transfer chamber 103, passes through the alignment chamber 104, and then loads the substrate 10 into one of the load-lock chambers 102. Then, after the interior of the load-lock chamber 102 is evacuated, the first transfer mechanism 106 transfers the substrate 10 to the reducing and oxidizing apparatus 200, the SAM forming apparatus 300, the film forming apparatus 400, and the plasma processing apparatus 500 so as to perform the film forming process of the embodiment. Then, if necessary, the plasma processing apparatus 500 removes the SAM 13 through the etching process.

After the above-described processes are completed, the substrate 10 is transferred to one of the load-lock chambers 102 by the first transfer mechanism 106, and the substrate 10 in the load-lock chamber 102 is returned to the carrier C by the second transfer mechanism 108.

The above-described processes are simultaneously performed in parallel on a plurality of substrates 10 so as to complete selective film forming processes on a predetermined number of substrates 10.

Since each of the processes is performed by an individual single-wafer apparatus, it is easy to set the optimum temperature for each process, and since a series of processes can be performed without breaking vacuum, it is possible to suppress oxidation during the processes.

<Exemplary Film Forming Process and SAM Forming Apparatus>

Next, examples of the reducing and oxidizing apparatus 200, a film forming apparatus such as the film forming apparatus 400, and the SAM forming apparatus 300 will be described.

Figure 5:
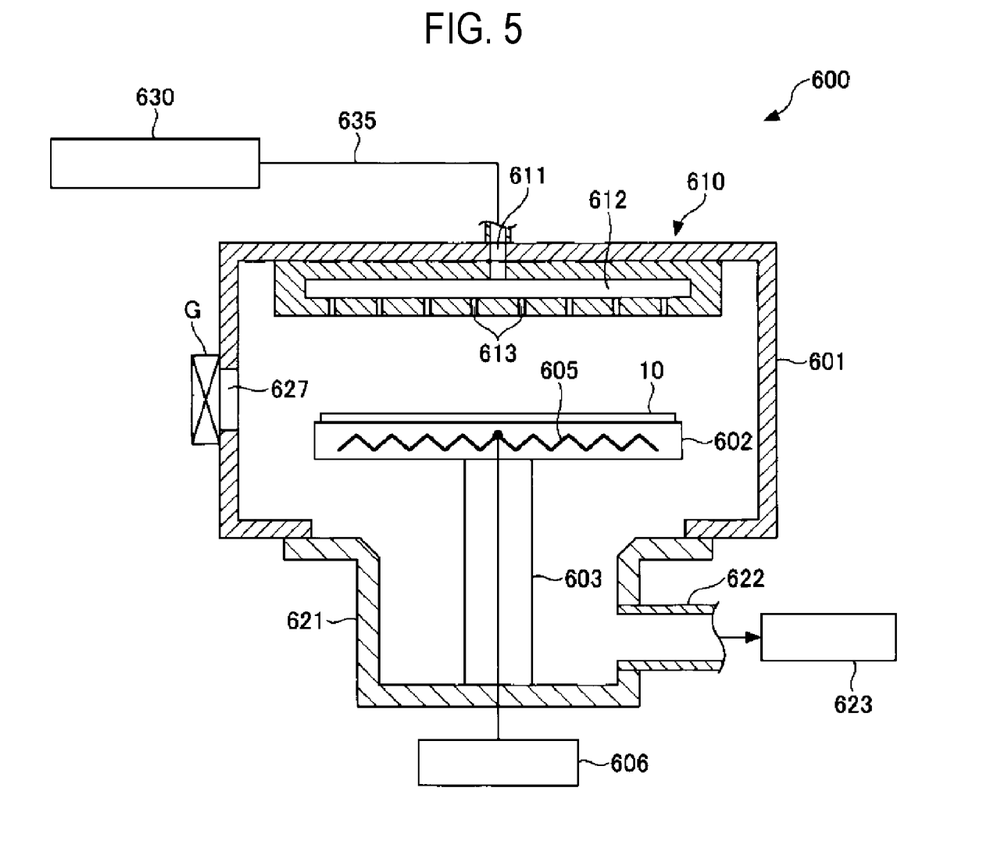
FIG. 5 is a cross-sectional view illustrating an exemplary processing apparatus that can be used as a film forming apparatus and an SAM forming apparatus.

FIG. 5 is a cross-sectional view illustrating an exemplary processing apparatus that can be used as a film forming apparatus and a SAM forming apparatus.

The reducing and oxidizing apparatus 200, the film forming apparatus 400, and the SAM forming apparatus 300 may be configured to have the same configuration. For example, each of these apparatuses may be configured as a processing apparatus 600 illustrated in FIG. 5.

The processing apparatus 600 has a substantially cylindrical processing container (chamber) 601 that is configured to be hermetically sealed, and a susceptor 602 for horizontally supporting the substrate 10 thereon is disposed in the processing container 601 and is supported by a cylindrical support 603 provided in the center of the bottom wall of the processing container 601. A heater 605 is embedded in the susceptor 602, and the heater 605 heats the substrate 10 to a predetermined temperature by being supplied with power from a heater power supply 606. The susceptor 602 is provided with a plurality of lifting pins (not illustrated) to protrude and retract with respect to the surface of the susceptor 602 so as to support and move the substrate 10 upward and downward.

A shower head 610 configured to introduce a processing gas for forming a film or forming an SAM into the processing container 601 in the form of a shower is provided on the ceiling wall of the processing container 601 so as to face the susceptor 602. The shower head 610 is provided in order to eject a gas supplied from a gas supply mechanism 630, which will be described later, into the processing container 601, and a gas inlet port 611 for introducing the gas is formed in the upper portion thereof. A gas diffusion space 612 is formed inside the shower head 610, and a plurality of gas ejection holes 613 in communication with the gas diffusion space 612 is formed in the bottom surface of the shower head 610.

The bottom wall of the processing container 601 is provided with an exhaust chamber 621, which protrudes downwards. An exhaust pipe 622 is connected to the side surface of the exhaust chamber 621, and an exhaust device 623 having, for example, a vacuum pump and a pressure control valve, is connected to the exhaust pipe 622. By operating the exhaust device 623, the interior of the processing container 601 can enter a predetermined depressurized (vacuum) state.

A loading and unloading port 627 for loading and unloading the substrate 10 to and from the vacuum transfer chamber 101 is provided in the side wall of the processing container 601, and the loading and unloading port 627 is opened and closed by a gate valve G.

The gas supply mechanism 630 includes, for example, gas sources of gases necessary for forming the AlO film 14 or the SAM 13, individual pipes configured to supply the gases from respective gas sources, and opening and closing valves and flow rate controllers such as mass flow controllers configured to control flow rates of the gases, which are provided in the respective individual pipes. The gas supply mechanism 630 further includes a gas supply pipe 635 configured to guide the gases from the respective individual pipes to the shower head 610 via the gas inlet port 611.

When the processing apparatus 600 forms the AlO film 14 through an ALD method, the gas supply mechanism 630 supplies a source gas of an organic compound and a reaction gas to the shower head 610. In addition, when the processing apparatus 600 forms the SAM, the gas supply mechanism 630 supplies a vapor of a compound for forming the SAM into the processing container 601. The gas supply mechanism 630 is configured to be capable of supplying an inert gas such as a $N_2$ gas or an Ar gas, as a purge gas or a heat transfer gas.

In the processing apparatus 600 configured as described above, the gate valve G is opened, and the substrate 10 is loaded into the processing container 601 via the loading and unloading port 627. Then, and the substrate 10 is placed on the susceptor 602. Since the susceptor 602 is heated to a predetermined temperature by the heater 605, the substrate 10 is heated when the inert gas is introduced into the processing container 601. Then, the interior of the processing container 601 is evacuated by the vacuum pump of the exhaust device 623 so as to adjust the pressure inside the processing container 601 to a predetermined pressure.

Subsequently, when the processing apparatus 600 forms the AlO film 14 through an ALD method, the source gas of the organic compound and the reaction gas are alternately supplied from the gas supply mechanism 630, with a purge process of the interior of the processing container 601 interposed between the supply of the source gas and the supply of the reaction gas. When the processing apparatus 600 forms the SAM, the gas supply mechanism 630 supplies the vapor of the organic compound for forming the SAM into the processing container 601.

According to the present disclosure, it is possible to enhance selectivity when selectively forming a metal oxide film in a desired region by using a self-assembled monolayer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method comprising:
preparing a substrate having a metal layer formed on a surface of a first region and an insulating layer formed on a surface of a second region, wherein the metal layer is formed of a first metal;
forming a self-assembled film on a surface of the metal layer by supplying a source gas of the self-assembled film;
after forming the self-assembled film, forming an oxide film of a second metal on the insulating layer through an atomic layer deposition method by repeating a supply of a precursor gas containing the second metal and a supply of an oxidizing gas; and
reducing an oxide film of the first metal formed on the surface of the metal layer by supplying a reducing gas through an intermolecular gap in the self-assembled film formed on the surface of the metal layer such that the oxide film of the first metal is chemically reduced to a metal film of the first metal,
wherein the supply of the reducing gas is performed after the supply of the oxidizing gas and before the subsequent supply of the precursor gas when repeating the supply of the precursor gas and the supply of the oxidizing gas.

2. The film forming method of claim 1, wherein the reducing the oxide film of the first metal is performed at least one of after the supply of the oxidizing gas or before the supply of the precursor gas when the supply of the precursor gas and the supply of the oxidizing gas are performed a plurality of times.

3. The film forming method of claim 2, wherein the second metal is aluminum (Al), hafnium (Hf), or zirconium (Zr).

4. The film forming method of claim 3, wherein the second metal is aluminum (Al), and the precursor gas is trimethylaluminum.

5. The film forming method of claim 4, wherein the oxidizing gas is water vapor ($H_2O$), hydrogen peroxide ($H_2O_2$), oxygen ($O_2$), or ozone ($O_3$).

6. The film forming method of claim 5, wherein the reducing gas is alcohol or hydrogen ($H_2$).

7. The film forming method of claim 6, wherein the alcohol of the reducing gas is isopropyl alcohol (IPA).

8. The film forming method of claim 7, wherein the source gas of the self-assembled film is a source gas of a thiol-based self-assembled film.

9. The film forming method of claim 8, further comprising, removing the self-assembled film from the surface of the metal layer after the forming the oxide film of the second metal.

10. The film forming method of claim 9, further comprising removing the oxide film of the first metal formed on the surface of the first metal by supplying the reducing gas to the substrate before the forming the self-assembled film.

11. The film forming method of claim 1, wherein the second metal is aluminum (Al), hafnium (Hf), or zirconium (Zr).

12. The film forming method of claim 11, wherein the second metal is hafnium (Hf), and the precursor gas is tetrakis (dimethylamino) hafnium, tetrakis (diethylamino) hafnium, or tetrakis (ethylmethylamino) hafnium.

13. The film forming method of claim 11, wherein the second metal is zirconium (Zr), and the precursor gas is tetrakis (dimethylamino) zirconium, tetrakis (diethylamino) zirconium, or tetrakis (ethylmethylamino) zirconium.

14. The film forming method of claim 1, wherein the oxidizing gas is water vapor ($H_2O$), hydrogen peroxide ($H_2O_2$), oxygen ($O_2$), or ozone ($O_3$).

15. The film forming method of claim 1, wherein the reducing gas is alcohol or hydrogen ($H_2$).

16. The film forming method of claim 1, wherein the source gas of the self-assembled film is a source gas of a thiol-based self-assembled film.

17. The film forming method of claim 1, further comprising, removing the self-assembled film from the surface of the metal layer after the forming the oxide film of the second metal.

18. The film forming method of claim 1, further comprising removing the oxide film of the first metal formed on the surface of the first metal by supplying the reducing gas to the substrate before the forming the self-assembled film.

19. The film forming method of claim 1,
wherein the supply of the reducing gas is performed after the self-assembled film has been formed, and
wherein reducing the oxide film of the first metal by the supply of the reducing gas is performed so as to inhibit the precursor gas from being adsorbed on the surface of the metal layer.

* * * * *